(12) United States Patent
Qin

(10) Patent No.: US 10,446,778 B2
(45) Date of Patent: Oct. 15, 2019

(54) OLED PANEL, OLED DISPLAY AND MANUFACTURING METHOD OF OLED PANEL

(71) Applicant: Wuhan China Star Optoelectronics Semiconductor Display Technology Co., Ltd., Wuhan, Hubei (CN)

(72) Inventor: Xuesi Qin, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/925,179

(22) Filed: Mar. 19, 2018

(65) Prior Publication Data

US 2019/0115552 A1    Apr. 18, 2019

Related U.S. Application Data

(63) Continuation of application No. PCT/CN2018/074140, filed on Jan. 25, 2018.

(30) Foreign Application Priority Data

Oct. 16, 2017    (CN) .......................... 2017 1 0974344

(51) Int. Cl.
*H01L 51/50* (2006.01)
*H01L 51/52* (2006.01)
*H01L 51/56* (2006.01)

(52) U.S. Cl.
CPC ...... *H01L 51/5012* (2013.01); *H01L 51/5056* (2013.01); *H01L 51/5072* (2013.01);
(Continued)

(58) Field of Classification Search
CPC ............. H01L 51/5012; H01L 51/5206; H01L 51/5221; H01L 51/56; H01L 51/5088;
(Continued)

(56) References Cited

U.S. PATENT DOCUMENTS

2006/0252336 A1    11/2006    Daniels
2006/0289853 A1*   12/2006    Chen ..................... B82Y 10/00
                                                      257/14
(Continued)

FOREIGN PATENT DOCUMENTS

CN    1589073 A    3/2005
CN    104934543 A  9/2015
(Continued)

OTHER PUBLICATIONS

Office Action dated Nov. 2, 2018 from corresponding application No. CN 201710974344.6.

*Primary Examiner* — Christine A Enad
(74) *Attorney, Agent, or Firm* — Hemisphere Law, PLLC; Zhigang Ma

(57)    ABSTRACT

The present disclosure relates to an OLED display panel and a manufacturing method of the same. The OLED panel includes an anode, a hole injection layer, a hole transport layer, a light-emitting layer, an electron transport layer and a cathode disposed on a substrate. The anode transporting holes to the hole injection layer, the holes penetrating the hole injection layer into the hole transport layer, the cathode transporting electrons to the electron transport layer. The electrons pass through the electron transport layer and enter the light-emitting layer. Magnetic particles are provided in the light-emitting layer and generate a magnetic field on the barrier layer where the hole transport layer and the light-emitting layer intersect to change trajectories of electrons and holes that fail to normally enter the barrier layer and
(Continued)

rebound, moving it again to the blocking layer for bonding, thereby increasing the internal quantum efficiency of the OLED assembly.

7 Claims, 3 Drawing Sheets

(52) U.S. Cl.
CPC ...... *H01L 51/5088* (2013.01); *H01L 51/5096* (2013.01); *H01L 51/5206* (2013.01); *H01L 51/5221* (2013.01); *H01L 51/56* (2013.01); *H01L 2251/5346* (2013.01)

(58) Field of Classification Search
CPC ............ H01L 51/5072; H01L 51/5056; H01L 51/5096
See application file for complete search history.

(56) References Cited

U.S. PATENT DOCUMENTS

| | | |
|---|---|---|
| 2008/0198441 A1 | 8/2008 | Cho |
| 2016/0027963 A1* | 1/2016 | Jun .......................... H01L 33/06 257/13 |
| 2016/0133848 A1* | 5/2016 | Balaganesan ........ C07D 333/76 257/40 |
| 2019/0048259 A1* | 2/2019 | Kim ...................... C09K 11/703 |
| 2019/0081249 A1* | 3/2019 | Saito ...................... C09K 11/06 |

FOREIGN PATENT DOCUMENTS

| | | |
|---|---|---|
| CN | 106206961 A | 12/2016 |
| CN | 107623078 A | 1/2018 |
| JP | 2004206964 A | 7/2004 |
| WO | 02058110 A2 | 7/2002 |

* cited by examiner

OLED PANEL, OLED DISPLAY AND MANUFACTURING METHOD OF OLED PANEL

RELATED APPLICATIONS

This application is a continuation application of PCT Patent Application No. PCT/CN2018/074140, filed Jan. 25, 2018, which claims the priority benefit of Chinese Patent Application No. CN 201710974344.6, filed Oct. 16, 2017, which is herein incorporated by reference in its entirety.

FIELD OF THE DISCLOSURE

The present disclosure relates to a display technology field, and more particularly to an OLED screen and an OLED panel.

BACKGROUND OF THE DISCLOSURE

OLED displays, that is, organic electroluminescent displays, have become more and more widely used due to their advantages of light emission, wide viewing angle, almost infinitely high contrast, low power consumption, and extremely high reaction speed. The luminous efficiency of OLED displays is a key parameter to evaluate the display performance. The higher the luminous efficiency, the more efficient the conversion of electric energy into light energy at a certain electric power, which is helpful to save power and improve the hour life of the OLED panel. The luminous efficiency of the OLED panel is related to the quantum efficiency and the light extraction rate in the OLED panel, and as a key parameter affecting the intrinsic luminescence, it is very important to improve the quantum efficiency in the luminescent layer. To improve the internal quantum efficiency of the light-emitting layer from the OLED manufacturing materials, light-emitting layer epitaxial growth process and OLED light-emitting layer of light on the way to be studied.

OLED luminescence technology is injection type luminescence, under forward voltage driving, the anode injects holes into the light-emitting layer (EML), the cathode injects electrons into the light-emitting layer, the injected holes and electrons meet in the luminescent layer to combine into excitons and excitons to recombine and transfer the energy to the luminescent material, which emits light after the radiation relaxation process. However, not every pair of electrons and holes will generate photons. Due to the material quality, dislocation factors and process defects in the light-emitting layer of the OLED panel, problems such as impurity ionization, excitation scattering, and lattice scattering arise. The electron transition from the excited state to the ground state and the lattice atoms or ion-exchange energy occurs when there is no radiation transition, that is, does not produce photons, this part of the energy is not converted into light and converted into heat energy loss in the light-emitting layer, so there is a composite carrier conversion efficiency, that is, Nint=(compound carriers generated photons/total number of composite carriers)×100%, called the OLED panel luminous internal quantum efficiency.

In the existing OLED structure, the hole transport layer (HIL) prevents the migration of free electrons, the light-emitting layer hinders the migration of holes. However, some holes enter the light-emitting layer through the blocking layer between the hole transport layer and the light-emitting layer, resulting in the blocking layer becoming a main region where electrons and holes recombine into excitons, that is, an area that emits light effectively. However, since the blocking layer is limited, and the blocking layer is an interlayer interface similar to the "wall" to prevent electrons from entering the hole transport layer, to some extent to prevent holes into the light-emitting layer, inevitably form a "rebound" of electrons and holes.

SUMMARY OF THE DISCLOSURE

The purpose of the present disclosure is to provide a simple structure of the light-emitting layer to have high internal quantum efficiency of the OLED panel to provide specific technical solutions are as follows.

An OLED panel in which an anode, a hole injection layer, a hole transport layer, a light-emitting layer, an electron transport layer and a cathode sequentially stacking on a glass substrate, wherein the anode is used to transport holes to the hole injection layer, the holes pass through the hole injection layer and enter the hole transport layer, the cathode is used to transport electrons to the electron transport layer, the electrons pass through the electron transport layer and enter the light-emitting layer, and magnetic particles are disposed in the light-emitting layer, the magnetic particles are configured to generate a magnetic field on a blocking layer where the hole transport layer and the light-emitting layer intersect, and the magnetic field is configured to increase the bonding rate between the hole and the electron.

The magnetic particles in the plane of the light-emitting layer are arranged in array equidistantly to form a plurality of N-poles and a plurality of S-poles uniformly distributed on the plane of the light-emitting layer, each of the N-poles is disposed adjacent to the S-poles.

The intensity of the magnetic field in the light-emitting layer changes stepwise or curvilinearly on cross-section of the light-emitting layer.

The magnetic field of the light-emitting layer near the end of the hole transport layer is stronger than the magnetic field of the end of the light-emitting layer near the end of the electron transport layer.

The present disclosure also relates to an OLED display made of the OLED panel described above.

The disclosure also discloses a manufacturing method of an OLED panel, which includes the following steps:
successively forming an anode, a hole injection layer and a hole transport layer on a glass substrate from bottom to top;
forming a light-emitting layer on the hole transport layer and adding magnetic particles in the light-emitting layer;
generating a magnetic field on a blocking layer where the hole transport layer and the light-emitting layer intersect by the magnetic particles, the magnetic field increasing the bonding rate of the hole and the electron; and
forming an electron transport layer and a cathode on the light-emitting layer.

The magnetic particles are injected into the light-emitting layer in an array by a segmented injection method to form a plurality of N-poles and a plurality of S-poles uniformly distributed in an array, each of the N-poles is disposed adjacent to the S-poles.

The segmented injection method has the same array spacing for each injection, so as to ensure that the distance between the magnetic poles is uniform.

The intensity of the magnetic field changes stepwise or curvilinearly on cross-section of the light-emitting layer.

The magnetic field of the light-emitting layer near the end of the hole transport layer is stronger than the magnetic field of the end of the light-emitting layer near the end of the electron transport layer.

The OLED panel of the disclosure can increase the quantum efficiency in the light-emitting layer, and the magnetic particles are added into the light-emitting layer in the OLED panel to form a magnetic field in the light-emitting layer, because of the action of the magnetic field, the electrons and holes in the light-emitting layer and the hole transport layer, which are rebound due to the blocking effect of the composite layer, are pulled back to the composite layer by the magnetic field to create the probability of occurrence of combination and achieve the light emission. The panels of the present disclosure, for the reduced internal quantum efficiency due to the rebound phenomenon, recreate the bonding conditions by introducing some of the bouncing electrons and holes into the magnetic field, with a series of targeted settings of the magnetic field, the internal quantum efficiency of the OLED assembly can be effectively improved.

DETAILED DESCRIPTION OF PREFERRED EMBODIMENTS

The technical solution in the embodiments of the present disclosure will be described clearly and completely hereinafter with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
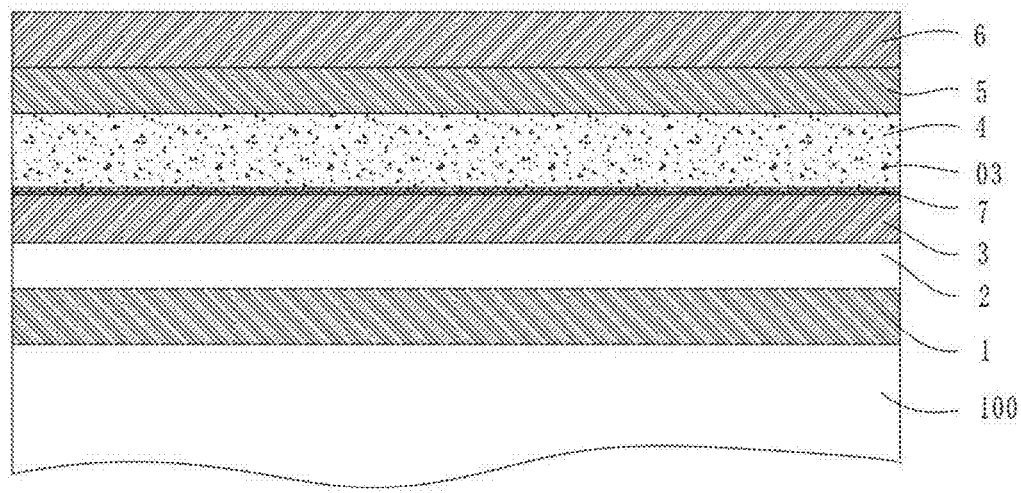
FIG. 1 is a schematic structural diagram of the OLED panel of the present disclosure.
Figure 2:
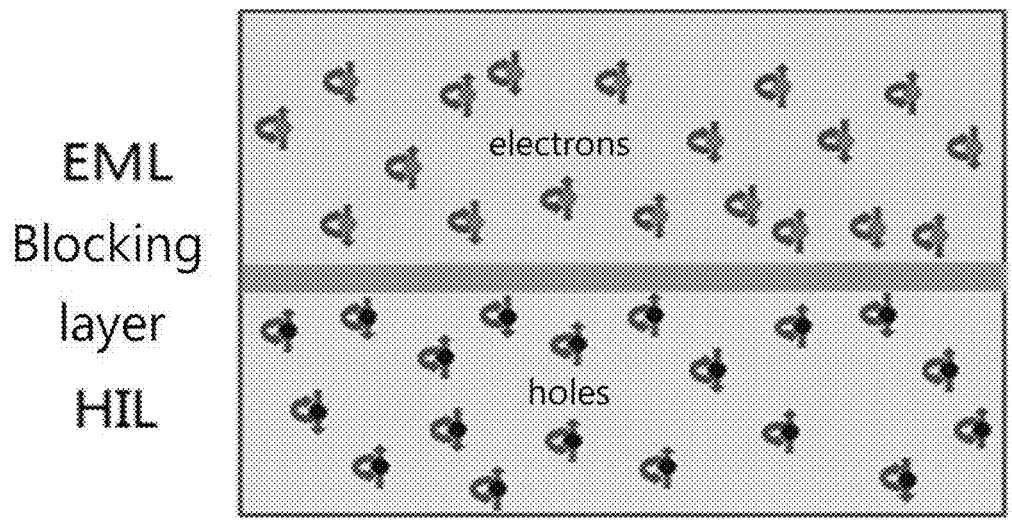
FIG. 2 is a schematic diagram of the light-emitting area of the OLED panel of the present disclosure.
Figure 3:
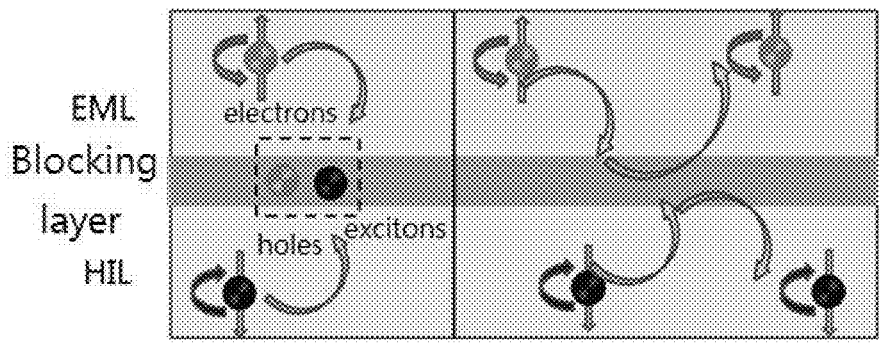
FIG. 3 is a schematic diagram of the light-emitting principle of the OLED panel of the present disclosure.
Figure 4:
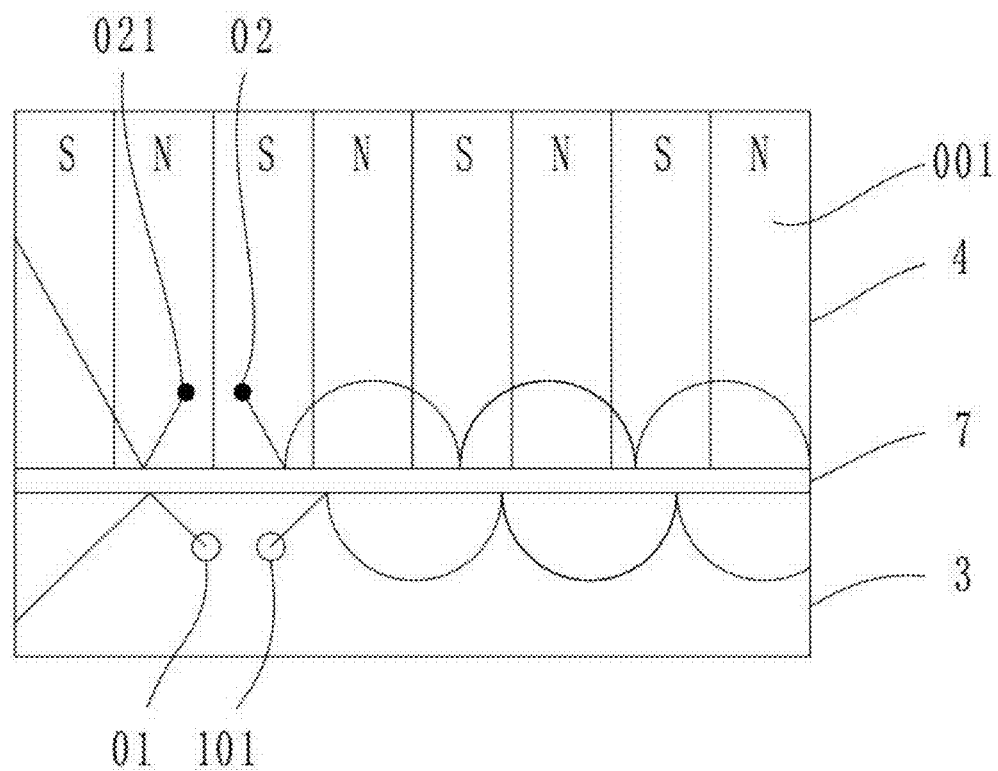
FIG. 4 is an effect diagram of the present OLED panel generates a magnetic field.

Referring to FIG. 1, an OLED panel of the present disclosure is directed to an OLED assembly disposed on a glass substrate 100, the assembly includes an anode 1, a hole injection layer 2, a hole transport layer 3, a light-emitting layer 4, an electron transport layer 5 and a cathode 6 stacked in that order from bottom to top. The anode 1 is used to transport holes 01 to the hole injection layer 2, the holes 01 pass through the hole injection layer 2 and enter the hole transport layer 3, the cathode 6 is used to transport electrons 02 to the electron transport layer 5. The electrons 02 pass through the electron transport layer 5 and enter the light-emitting layer 4. The light-emitting layer 4 and the hole transport layer 3 intersect with a blocking layer 7 (see FIG. 2), the hole transport layer 3 blocks the migration of the electrons 02, the light-emitting layer 4 hinders the migration of the holes 01, but some of the holes 01 enter the light-emitting layer 4 through the blocking layer 7 between the hole transport layer 3 and the light-emitting layer 4, the holes 01 and the electrons 02 are combined on the blocking layer 7 to generate light energy. The light-emitting layer 4 is provided with magnetic particles 03, the magnetic particles 03 generate a magnetic field 001 in the light-emitting layer 4 and can not enter the holes 011 and the electrons 021 of the blocking layer 7, will rebound upon encountering the blocking layer 7 and move away from the composite layer 7 (see FIG. 3). While the partially repulsed hole 01 and the electron 02 undergo a cycloidal or circular motion under the action of the magnetic field 001 to change the direction to move back to the composite layer 7. Thereby again providing the opportunity for the holes 01 and the electrons 02 to be combined (see FIG. 4), so as to achieve the effect of improving the internal quantum efficiency of the OLED panel.

In one embodiment, the magnetic field 001 in the light-emitting layer 4 is a plurality of N-poles and a plurality of S-poles distributed in a uniform array. Each of the N-poles is disposed adjacent to the S-poles and has the same pitch. The uniform magnetic pole can ensure that the electrons 021 and the holes 011 that can not enter the blocking layer maintain a regularity in each cycloidal or circular motion. Not due to sudden changes in magnetic force sudden or sudden changes in the cycloid, you can create a limited area of more opportunities to combine. At the same time, uniform poles are more conducive to the uniformity and consistency of preparation.

In an embodiment, the intensity of the magnetic field 001 in the light-emitting layer 4 is in a stepwise or curve-decreasing form on the cross-section of the light-emitting layer 4. The greater the concentration of the magnetic particles 03 in the same depth direction is, the more obvious its effect in the depth direction is. The more easily magnetic pole 03 is horizontally polarized in the light-emitting layer 4, disrupting the effect of the magnetic field 001 in the light-emitting layer on the horizontal plane of the hole 01 and the electron 021 that can not enter the blocking layer 7, but rather counterproductive. The magnetic field 001 in the form of a step-like or curve-decreasing form on the cross-section of the light-emitting layer 4 can eliminate the magnetic force in the depth direction and reduce the interference.

Figure 5:
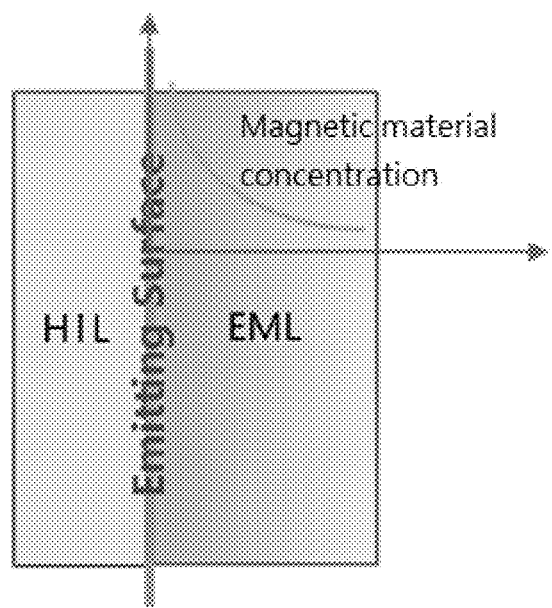
FIG. 5 is a magnetic curve diagram of the OLED panel of the present disclosure.

Obviously, the magnetic field 001 is set to have a stronger magnetic force in the light-emitting layer 4 near one end of the hole transport layer 3 than the magnetic force (see FIG. 5) of the light-emitting layer 4 near one end of the electron transport layer 5. A stronger magnetic field effect can be formed near the blocking layer 7 and the more holes 01 and the electrons 02 that undergo rebound phenomenon can be pulled back to the magnetic field to enhance the internal quantum efficiency of the panel of the present disclosure.

The OLED display made of the OLED panel of the present disclosure also has higher internal quantum efficiency because of the light-emitting layer 4 containing magnetic particles 03. Compared with the average OLED display has a lower power consumption and longer life expectancy.

The disclosure also discloses a manufacturing method of an OLED panel, which includes the following steps:
successively forming the anode 1, the hole injection layer 2 and the hole transport layer 3 on the glass substrate 100, when the light-emitting layer 4 is further formed on the hole transport layer 3, adding the magnetic particles 03 to the light-emitting layer 4 at the same time, the magnetic particles 03 are used for generating a magnetic field 001 on the blocking layer 7 where the hole transport layer 3 and the light-emitting layer 4 intersect, the magnetic field 001 can increase the bonding rate between the hole 01 and the electron 02, that is, increase the internal quantum efficiency of the OLED panel, finally, the electron transport layer 5 and the cathode 6 are further formed on the light-emitting layer 4.

The method for adding the magnetic particles 03 in the light-emitting layer 4 may be implemented by means of implantation, chemical vapor deposition (CVD), sputtering, or the like.

For example, the magnetic particles 03 are injected into the light-emitting layer 4 in an array by a segmented injection method. The magnetic particles 03 form a plurality of N and S poles distributed in an array in the light-emitting layer. It is reflected that a magnetic field structure similar to the surface of the magnetron sputtering target is formed at the blocking layer 7. When the electrons 02 and the holes 01 are rebound phenomenon. Through the action of a magnetic field, the electrons 02 and the holes 01 move back to the blocking layer 7 through cycloidal or arc motion. Preferably, the arrayed sub-arrays have the same pitch, which ensures that the distance between the magnetic poles is uniform and is more conducive to the uniformity and consistency of preparation.

In some embodiments, the intensity of the magnetic field 001 is in a stepwise or curve-decreasing form on the cross-section of the light-emitting layer 4. During implantation, by controlling the depth of doping by the process, the concentration of the magnetic particles 03 implanted at the further away from the blocking layer 7 is lower, the magnetic force of the light-emitting layer 4 near one end of the blocking layer 7 is stronger than the magnetic force effect of the light-emitting layer 4 near one end of the electron-transporting layer 5 to control the gradient or curvature of the curve. From the principle of this method can easily think of, in order to pull more holes 01 and the electrons 02 back to the magnetic field where the rebound phenomenon occurs, the magnetic strength requirement in the vicinity of the blocking layer 7 is greater than the magnetic strength requirement in the contact surface between the light-emitting layer 4 and the electron transport layer 5. If the magnetic field 001 in the light-emitting layer 4 is not differentiated by a gradient or a curve, the magnetic intensity is set to be the same at each depth of the cross-section. There is the possibility of affecting the motion of the originally incident hole 01 and the electron 02, with adverse consequences.

Obviously, parameters such as the segment injection pitch, the step or curve curvature setting of the magnetic field 001 can be adjusted according to actual effects. By repeatedly matching and optimizing the indexes such as the spacing, concentration, and depth of the magnetic particles 03 injected, a better effect of improving the internal quantum efficiency can be obtained.

For the OLED panel of the present disclosure, the OLED display panel made using this panel may contain one or even more layers of the light-emitting layer containing the magnetic particles. The magnetic field formed by the magnetic particles acts on the holes and the electrons that generate the rebound phenomenon and changes the motion trajectory away from the blocking layer to cycloidal or arc shape, the holes and electrons that have bounced back create the opportunity to move toward the blocking layer once again to seek the opportunity to combine and emit light, which improves the internal quantum efficiency of the OLED device and greatly helps to save power and improve the hour life of the OLED panel. The OLED panel prepared by the method conforms to the manufacturing process of the existing OLED panel, only one layer of the structure of the manufacturing process to add a step, the overall process changes smaller, but can reap the benefits of large, reducing the power consumption of OLED panels, but also enhance the life of the panel.

What is claimed is:

1. An OLED display panel in which an anode, a hole injection layer, a hole transport layer, a light-emitting layer, an electron transport layer and a cathode sequentially stacking on a glass substrate, wherein the anode is configured to transport holes to the hole injection layer, the holes pass through the hole injection layer and enter the hole transport layer, the cathode is configured to transport electrons to the electron transport layer, the electrons pass through the electron transport layer and enter the light-emitting layer, and magnetic particles are disposed in the light-emitting layer, the magnetic particles are configured to generate a magnetic field on a blocking layer where the hole transport layer and the light-emitting layer intersect, and the magnetic field is configured to increase a bonding rate between the hole and the electron;

wherein an intensity of the magnetic field in the light-emitting layer changes stepwise or curvilinearly on cross-section of the light-emitting layer.

2. The OLED panel according to claim 1, wherein the magnetic particles in a plane of the light-emitting layer are arranged in array equidistantly to form a plurality of N-poles and a plurality of S-poles uniformly distributed on the plane of the light-emitting layer, each of the N-poles is disposed adjacent to the S-poles.

3. The OLED panel according to claim 1, wherein a magnetic field of the light-emitting layer near an end of the hole transport layer is stronger than a magnetic field of an end of the light-emitting layer near an end of the electron transport layer.

4. An OLED display comprising an OLED panel, wherein the OLED panel is sequentially provided with an anode, a hole injection layer, a hole transport layer, a light-emitting layer, an electron transport layer and a cathode on a glass substrate, the anode is configured to transport holes to the hole injection layer, the holes pass through the hole injection layer and enter the hole transport layer, the cathode is configured to transport electrons to the electron transport layer, the electrons pass through the electron transport layer and enter the light-emitting layer, and magnetic particles are disposed in the light-emitting layer, the magnetic particles are configured to generate a magnetic field on a blocking layer where the hole transport layer and the light-emitting layer intersect, and the magnetic field is configured to increase a bonding rate between the hole and the electron;

wherein an intensity of the magnetic field in the light-emitting layer changes stepwise or curvilinearly on cross-section of the light-emitting layer.

5. A manufacturing method of an OLED panel, comprising the following steps:

successively forming an anode, a hole injection layer and a hole transport layer on a glass substrate from bottom to top;

forming a light-emitting layer on the hole transport layer and adding magnetic particles in the light-emitting layer;

generating a magnetic field on a blocking layer where the hole transport layer and the light-emitting layer intersect by the magnetic particles, the magnetic field increasing a bonding rate of the hole and the electron; and forming an electron transport layer and a cathode on the light-emitting layer;

wherein the magnetic particles are injected into the light-emitting layer in an array by a segmented injection method to form a plurality of N-poles and a plurality of S-poles uniformly distributed in an array, each of the N-poles is disposed adjacent to the S-poles; and wherein the segmented injection method has a same array spacing for each injection, so as to ensure that a distance between the magnetic poles is uniform.

6. The manufacturing method of an OLED panel according to claim 5, wherein an intensity of the magnetic field changes stepwise or curvilinearly on cross-section of the light-emitting layer.

7. The manufacturing method of an OLED panel according to claim 6, wherein a magnetic field of the light-emitting layer near an end of the hole transport layer is stronger than a magnetic field of an end of the light-emitting layer near an end of the electron transport layer.

\* \* \* \* \*